United States Patent [19]
Metro et al.

[11] Patent Number: 5,343,141
[45] Date of Patent: Aug. 30, 1994

[54] TRANSISTOR OVERCURRENT PROTECTION CIRCUIT

[75] Inventors: John G. Metro, Kingston; Denis P. Galipeau, Woonsocket, both of R.I.

[73] Assignee: Cherry Semiconductor Corporation, East Greenwich, R.I.

[21] Appl. No.: 896,049

[22] Filed: Jun. 9, 1992

[51] Int. Cl.$^5$ ............................ G05F 1/56; H02H 7/00
[52] U.S. Cl. ................................ 323/288; 323/316; 323/908; 361/18; 361/101; 330/298
[58] Field of Search ............... 323/276, 277, 282, 288, 323/315, 316, 908; 361/18, 98, 101; 330/298

[56] References Cited

U.S. PATENT DOCUMENTS

| | | |
|---|---|---|
| 3,792,316 | 2/1974 | Bondini et al. |
| 3,845,405 | 10/1974 | Leidich |
| 3,924,158 | 12/1975 | Farnsworth |
| 4,021,701 | 5/1977 | Davies |
| 4,254,372 | 3/1981 | Moore, Jr. ........................... 323/277 |
| 4,321,648 | 3/1982 | Kaplan |
| 4,330,757 | 5/1982 | Fukaya et al. |
| 4,428,015 | 1/1984 | Nesler ..................................... 361/18 |
| 4,593,338 | 6/1986 | Takeda et al. ....................... 361/18 |
| 4,779,062 | 10/1988 | Scheraga |
| 4,870,533 | 9/1989 | Bahlmann |
| 4,893,211 | 1/1990 | Bynum et al. ......................... 361/18 |
| 5,004,970 | 4/1991 | Barou ................................. 323/277 |
| 5,084,668 | 1/1992 | Kotowski et al. .............. 323/277 X |

Primary Examiner—Emanuel T. Voeltz
Attorney, Agent, or Firm—Robert M. Asher

[57] ABSTRACT

A transistor overcurrent protection circuit using an error amplifier to make a voltage comparison between a threshold voltage and the collector voltage of a current sensing transistor. The current sensing transistor is arranged in a circuit such that the collector current of the current sensing transistor is a measure of the collector current of an output transistor. A driver transistor has its emitter connected to the base of the output transistor. A source of control current to the drive transistor is coupled to the output of the error amplifier. When the collector voltage of the current sense transistor falls below the threshold voltage, the error amplifier causes the control current to the drive transistor to be reduced so as to reduce the collector current of the output transistor.

41 Claims, 4 Drawing Sheets

TRANSISTOR OVERCURRENT PROTECTION CIRCUIT

BACKGROUND OF THE INVENTION

The present invention relates to transistor protection circuitry. The invention is suitable for manufacture in integrated circuit form and can be used in many types of circuits which provide an output current that requires limiting.

Current limit circuits are employed to protect devices and loads from excessive damaging currents. They fall into two main classifications—direct current limit schemes and indirect or approximate current limit schemes. The present invention is directed to an approximate current limit circuit. An approximate current limit circuit is comprised of:

an output transistor of a particular conductivity type made up of a collector, base and emitter, a driver transistor of the same conductivity type made up of collector, base and emitter configured so that the emitter of the driver transistor couples to the base of the output transistor, a current sensing transistor of the same conductivity type made up of collector, base and emitter and connected so that the base and emitter of the current sensing transistor is tied to the base and emitter, respectively, of the output transistor so that the collector current of the current sensing transistor is a measure of the current flowing in the output transistor, and circuitry for limiting the collector current of the output transistor based on the collector current of the sensing transistor.

Circuits which use the approximate current limit scheme as described above are known in the art. For example, U.S. Pat. No. 4,330,757 (Fukuya et al.) discloses a circuit in which the current through the output transistor is measured by means of a current sensing transistor whose base-emitter junction is arranged in parallel with that of the output transistor, the collector current of the current sensing transistor being a fraction of the collector current of the output transistor. By means of a current mirror, the collector current of the current sensing transistor is reflected to a resistance element which is arranged in parallel with the base-emitter junction of a clamping transistor, the collector of the clamping transistor being connected to the base of the driver transistor. In the case of an excessive collector current of the current sensing transistor the clamping transistor is driven into conduction so that, what would otherwise be a part of the base current of the driver transistor is drained via the clamping transistor.

Also, U.S. Pat. No. 4,870,533 (Bahlmann) discloses a transistor protection circuit using the approximate current limit scheme. This patent discloses a current limit means which relies on a reference current and a current comparison. When the collector current of the current sensing transistor is substantially equal to the reference current, drive current to the output transistor is drained.

It is desirable in approximate current limit schemes to avoid the use of PNP transistors. Such transistors introduce instability in the current limit loop due to phase shifts caused by low cutoff frequencies associated with these transistors.

SUMMARY OF THE INVENTION

The present invention is directed to a transistor overcurrent protection circuit which relies on the performance of a voltage comparison to determine when to drain drive current from the output transistor. A current sensing transistor is arranged with respect to an output transistor so that the collector current of the current sensing transistor is a measure of the collector current of the output transistor. A driver transistor has an emitter coupled to the base of the output transistor. A source of control current is coupled to the base of the driver transistor. An error amplifier is employed having a first input connected to a threshold voltage and a second input coupled to the collector of the sensing transistor. When the collector voltage of the sensing transistor falls below the threshold voltage, the error amplifier effectively reduces drive current to the output transistor.

A current generator may be included which generates two currents, one for controlling the control current and the other for driving the error amplifier. The current generator advantageously maintains a relationship between the Control current and the current to the error amplifier to ensure the error amplifier has the capacity to sink the entire control current if necessary. The threshold voltage used at the error amplifier may be derived from a reference voltage. That same reference voltage may also then be used in conjunction with the current sensing transistor to set the collector voltage of the current sensing transistor.

In accordance with an additional feature of the invention, a diode having its anode connected to the error amplifier and its cathode connected to the base of the driver transistor may be used as a voltage level shifter to protect the error amplifier against saturation.

Other objects and advantages of the present invention will become apparent during the following description of the presently preferred embodiments of the invention taken in conjunction with the drawings.

DETAILED DESCRIPTION OF THE PREFERRED EMBODIMENTS

Figure 1:
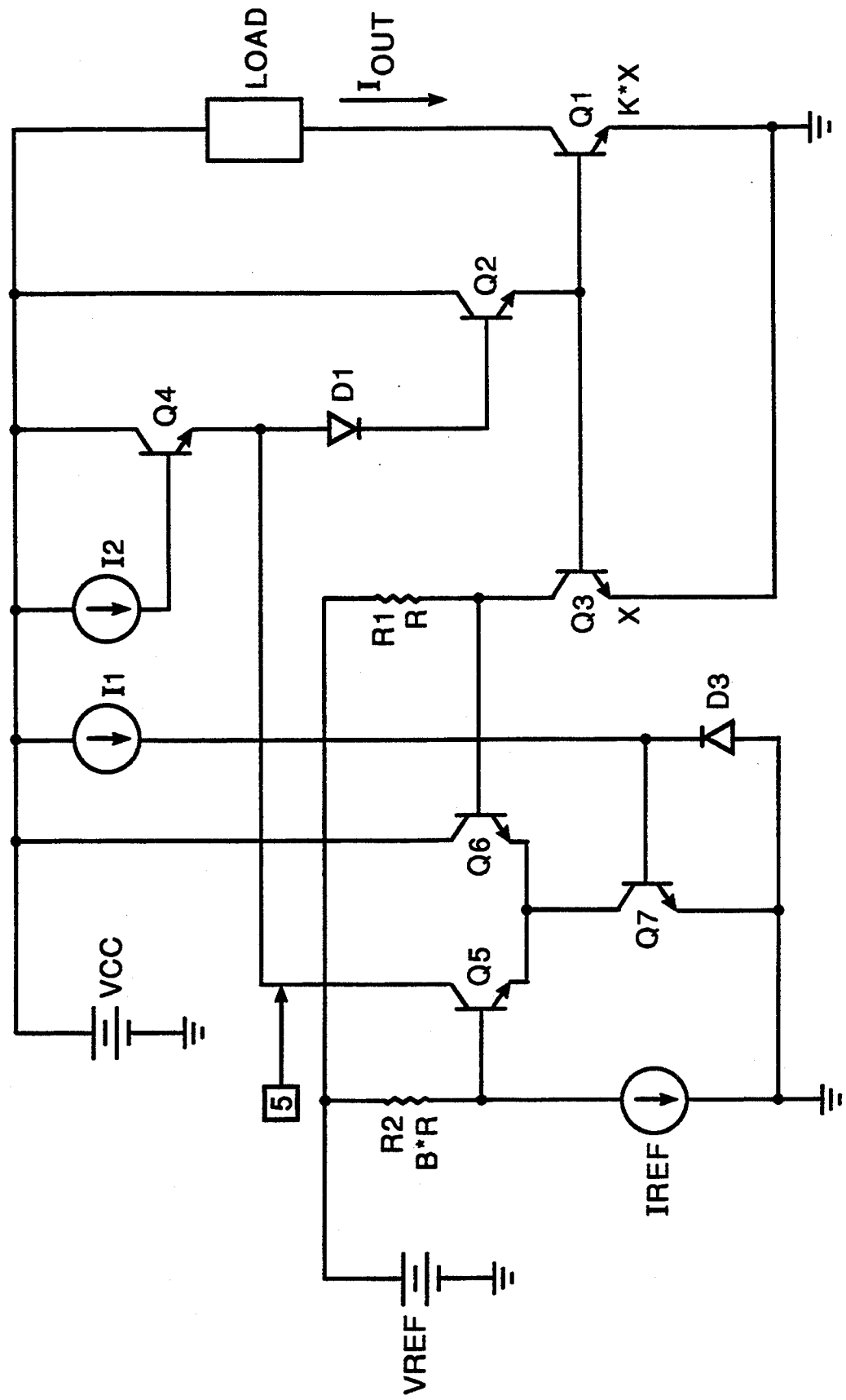
FIG. 1 is a schematic diagram of the transistor overprotection circuit of the present invention.

The invention shall now be described with reference to the schematic of FIG. 1. The purpose of the invention is to protect an output transistor Q1 from overcurrent conditions. The output transistor provides a current $I_{OUT}$ to a load through its collector. The emitter of the output transistor Q1 is tied to a negative power line which is signified by a ground symbol in the drawings. The output transistor Q1 is driven by a driver transistor Q2. While a transistor is generally preferred for driving the output transistor it is possible to use a diode instead. The emitter of driver transistor Q2 connects to the base of output transistor Q1. Current limiting is accomplished by limiting the base drive current to output transistor Q1 through the regulation of the collector current of driver transistor Q2. Similarly, regulation of collector current in driver transistor Q2 is accomplished by controlling a control current to the base of driver transistor Q2. As illustrated in FIG. 1, the source of control current to the base of driver transistor Q2 is provided by a current source I2, a control current source transistor Q4 and a diode D1. The current generated by control current source transistor Q4 is equal to the fixed current generated by current source I2 multiplied by the current gain factor, $\beta$, of transistor Q4. Current limiting is achieved in the present invention by controlling the amount of control current supplied to the base of drive transistor Q2.

An error amplifier connected to the emitter of transistor Q4 has the capacity to sink the entire control current output from the emitter of transistor Q4 so as to ensure complete regulation of driver transistor Q2 and as a result, regulate output transistor Q1. The error amplifier is formed by three transistors Q5, Q6 and Q7. The collector of first transistor Q5 is the output of the error amplifier and serves to regulate the control current to driver transistor Q2. The first transistor Q5 of the error amplifier has its base serving as an inverting input. The base of the first transistor Q5 is connected to a threshold voltage. In the embodiment of FIG. 1, the threshold voltage is formed by providing a fixed reference voltage Vref and a reference resistor R2 connected between the reference voltage and the base of first transistor Q5. The source of the reference voltage Vref may be an on-chip regulator, an external source or some other equivalent source known in the art. A reference current source provides a fixed current Iref through the reference resistor R2 to set a fixed threshold voltage at the base of first transistor Q5. Alternatively, the reference current source may be replaced by a resistor. This would form a voltage divider with reference resistor R2 to set the fixed threshold voltage. The reference current in this alternate case is determined by Vref divided by the sum of the reference resistor R2 and the resistor replacing the current source.

A second transistor Q6 of the error amplifier has its base serve as the non-inverting input to the error amplifier. The voltage at the base of second transistor Q6 is arranged so as to be proportional to the output current $I_{OUT}$ through the output transistor Q1. The error amplifier compares this voltage to the threshold voltage.

A current sensing transistor Q3 is configured with its base-emitter junction parallel to the base-emitter junction of output transistor Q1. In accordance with the preferred embodiment of the invention, the current sensing transistor Q3, the output transistor Q1, the driver transistor Q2 and the control current source transistor Q4 are all NPN transistors. The base-emitter area of output transistor Q1 is larger than that of the current sensing transistor Q3 by a factor of K. This causes the collector current of current sensing transistor Q3 to be smaller than that of the output transistor Q1 by the factor K. The collector current of the current sensing transistor thus tracks the output current of output transistor Q1 to provide a measure of that output current. In order to obtain a voltage measure of the output current, in accordance with the embodiment of FIG. 1, a sensing resistor R1 is connected between the reference voltage Vref and the collector of the current sensing transistor Q3. The base of the second transistor Q6 from the error amplifier is connected to the end of the current sense resistor opposite to the reference voltage Vref. Sensing resistor R1 converts the collector current of current sense transistor Q3 into an input voltage to the error amplifier. Thus, the collector voltage of current sensing transistor Q3 is the input voltage to the error amplifier.

A current source I1 is provided for connection to the error amplifier. It is desirable that the current provided by current source I1 be larger than the current provided by current source I2. This is to ensure that the error amplifier has the capacity to sink all of the control current provided by transistor Q4. The third transistor Q7 of the error amplifier has its base connected to receive the current I1. The collector current of the third transistor Q7 is determined by multiplying the current I1 times the current gain factor, $\beta$, of the third transistor Q7. Thus, the collector current of third transistor Q7 should always exceed the maximum control current provided by transistor Q4.

To protect first transistor Q5 of the error amplifier from saturating, a diode D1 is inserted between the collector of the first transistor Q5 and the base of the driver transistor Q2. The anode of diode D1 is coupled to the collector of first transistor Q5 and the cathode of diode D1 is connected to the base of the driver transistor Q2. The diode D1 acts as a voltage level shifter. It raises the collector voltage of first transistor Q5 so that when first transistor Q5 turns on, its base to collector voltage is prevented from becoming negative.

Temperature compensation for the base current to third transistor Q7 of the error amplifier is accomplished with the use of a diode D3. The diode D3 is connected between the base of the third transistor and the negative power line. As temperature increases, both the transistor current gain factor $\beta$ and leakage current across the collector-base junction increase. Without compensation, the leakage current would add to the base current and get multiplied by $\beta$ thereby causing an error much larger than just the leakage current. The diode D3 has a temperature induced leakage current which tracks that of third transistor Q7 so that the leakage current of third transistor Q7 is essentially sunk to ground through the leakage current of diode D3.

The operation of the circuit of FIG. 1 is as follows. If the output current $I_{OUT}$ is less than the current limit value, the collector current of current sensing transistor Q3 causes the voltage drop across current sensing resistor R1 to be smaller than the drop across the reference resistor R2. This results in a higher voltage at the non-inverting input at the base of second transistor Q6 in the error amplifier than at the inverting input at the base of first transistor Q5. The second transistor Q6 then conducts more current than does the first transistor Q5. Since the collector current of third transistor Q7 is supplied through both the first transistor Q5 and the second transistor Q6, most of the collector current for third transistor Q7 will in this condition be supplied through the second transistor Q6. The lower level of collector current in first transistor Q5 will permit the majority of control current from the control current source transistor Q4 to drive the base of driver transistor Q2. This causes driver transistor Q2 to provide more drive current to the base of the output transistor Q1 and results in the output current increasing.

As the output current increases, so does the collector current of current sensing transistor Q3 increase. Thus, the voltage drop across sense resistor R1 increases until the base voltage of second transistor Q6 is approximately equal to the base voltage of first transistor Q5. When this threshold point has been reached, the collector current of third transistor Q7 is supplied about equally by both first transistor Q5 and second transistor Q6. Thus, additional current is diverted from the emitter of control current source transistor Q4 into the collector of first transistor Q5. This reduces the control current reading the base of driver transistor Q2 which acts to reduce the output current through the output transistor Q1. At some point, an equilibrium condition is reached where any further increase in the output current causes a decrease in the emitter current of drive transistor Q2 decreasing the base current of output transistor Q1 and so reducing the output current. The current limit value for the circuit of FIG. 1 is approximately defined as $$I_{limit} = I_{ref} \times (R2/R1) \times K$$

where K is the ratio of the emitter area of output transistor Q1 to the emitter area of current sense transistor Q3. The relationship is an approximate one because the voltage drop across resistor R1 will be somewhat larger than that across the reference resistor R2 when the limiting circuitry is on.

Figure 2:
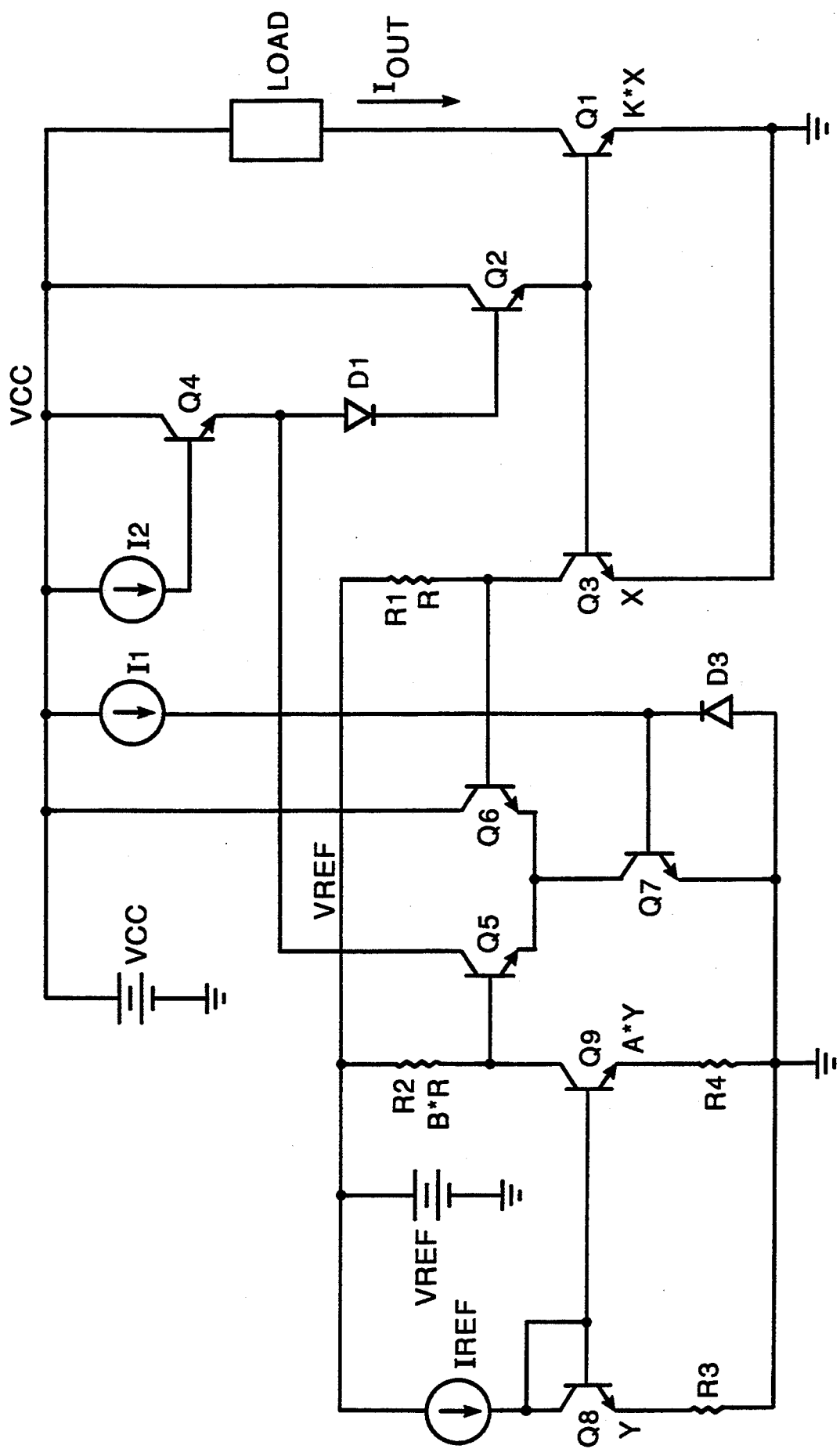
FIG. 2 is an alternate embodiment of the transistor overprotection circuit of the present invention.

There are numerous methods within the scope of the present invention for providing a threshold voltage at the inverting input to the error amplifier at the base of the first transistor Q5. Referring now to FIG. 2, one such alternate method is illustrated. An NPN current mirror is used to provide an additional scaling factor on the current source Iref. This arrangement may also be useful in regulating several output channels at the same time where one reference current is established and then mirrored to the numerous channels. A current source Iref provides fixed current to the input of the current mirror. The current mirror is formed by a first NPN transistor Q8 having its base-emitter junction connected in parallel with the base-emitter junction of a second transistor Q9. The emitter area of transistor Q9 is a scaling factor A times as large as the emitter area of the first transistor Q8. A resistor R3 is connected between the emitter of transistor Q8 and the negative power line signified here as ground. A resistor R4 is connected between the emitter of transistor Q9 and the negative power line. The ratio of the resistors R3 and R4 provide an additional scaling factor to the current. For the embodiment of FIG. 2, the current limit value is approximately defined as $$I_{limit} = (R2/R1) \times$$

$$K \times I_{ref} \times A \times \exp\left[\frac{(I_{ref} \times R3) - (I_c(Q9) \times R4)}{V_T}\right]$$

in which Ic can be solved iteratively through the use of the following equation:

$$I_c(Q9) = A \times I_{ref} \times \exp\left[\frac{(I_{ref}) \times R3 - (I_c(Q9) \times R4)}{V_T}\right]$$

In these equations, A is the ratio of emitter areas of transistor Q9 over the transistor Q8 and $V_T = kT/q$ where k equals the Boltzmann's constant, T=Kelvin temperature and q=electronic charge. These are transcendental equations requiring iterative solution.

If a particular ratio of Ic(Q9) to Iref is desired, then Ic(Q9) can be defined as Iref multiplied by a constant W. The equation for Ic (Q9) then becomes $$I_c(Q9) = A \times I_{ref} \times \exp\left[\frac{(I_{ref} \times R3) - (W \times I_{ref} \times R4)}{V_T}\right]$$

For given values of W and R3, the value of R4 is determined by $$R4 = \frac{R3}{W} - \frac{V_T \times \ln(W/A)}{W \times I_{ref}}$$

It should be noted that if the ratio of the emitter areas of Q9 over Q8 is unity and R3 and R4 have identical values then the formula reduces to that for the embodiment of FIG. 1. The configuration of FIG. 2 adds a temperature coefficient to the current limit value unless the ratio of resistors R3/R4 is inversely proportional to the ratio of emitter areas of transistor Q9 over transistor Q8. The operation of this circuit is otherwise identical to that of FIG. 1.

Figure 3:
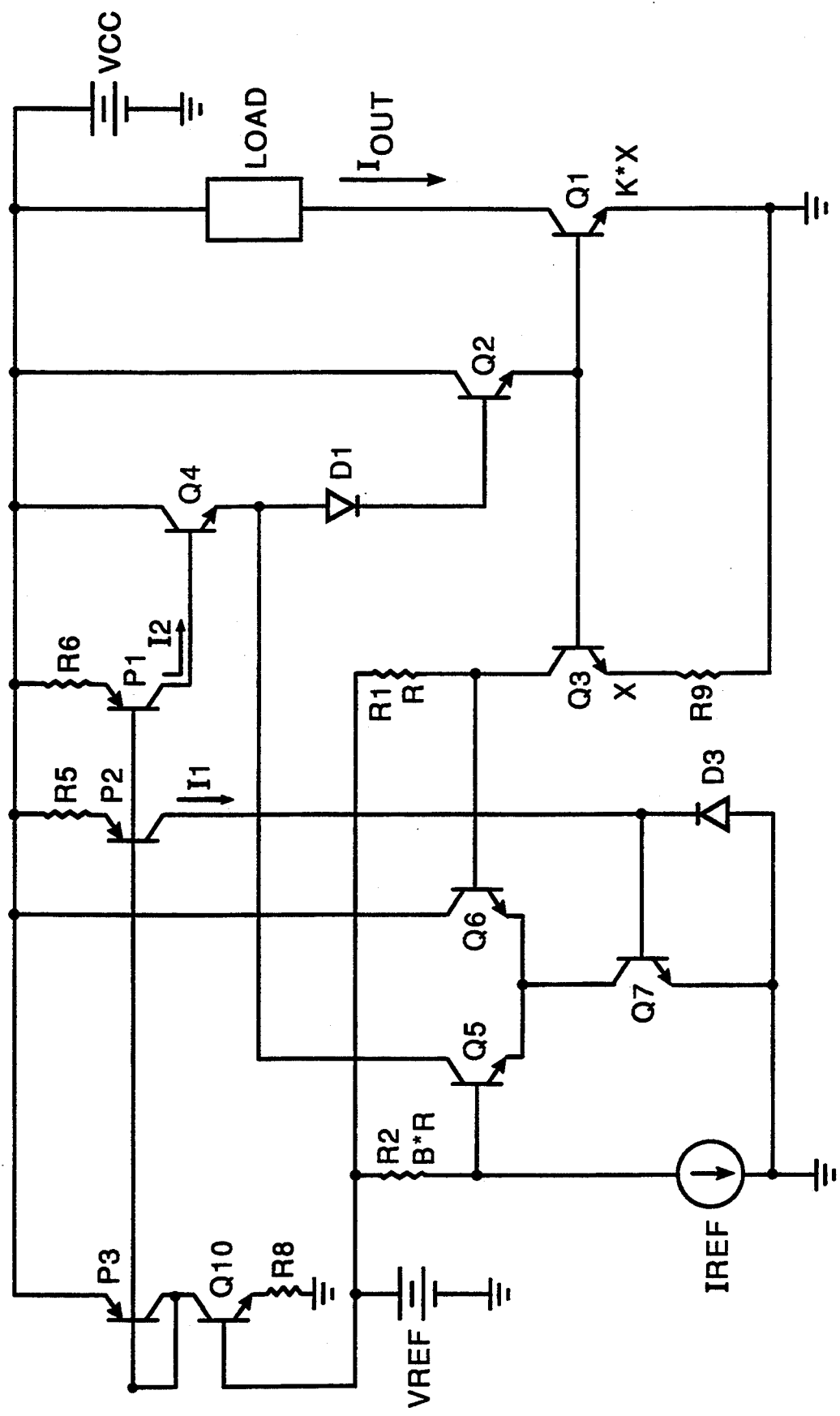
FIG. 3 is a second alternate embodiment of the transistor overprotection circuit of the present invention.

There are numerous methods for providing the currents I1 and I2 shown in FIG. 1. Instead of generating two current sources independently, a current generator may be provided in which the two currents are related by generating them through the use of a current mirror with a common input current. As shown in FIG. 3, a PNP current mirror may be used. Since the current mirror is outside of the control loop, the use of PNP transistors for this function does not introduce instability to the current limit circuit. For controlling the control current provided by control current source transistor Q4, a PNP transistor P1 has its emitter connected to a resistor R6. Current for use by the error amplifier is provided through a PNP transistor P2 which has an emitter connected to a resistor R5. The bases of PNP transistors P1 and P2 are connected to one another. Resistors R5 and R6 are hung from the positive power line Vcc. In order to maintain the current to the error amplifier larger than the current for controlling the control current source transistor Q4, the resistor R5 is made smaller than resistor R6.

The input current to the PNP current mirror may be supplied in a number of different ways. For example, in parallel with the PNP current mirror, a diode and resistor may be connected between the positive power line and the negative power line. Alternatively, a constant current source can provide the input current. FIG. 3 shows a method of providing input current to the PNP current mirror in which the reference voltage is used. The circuit thus operates independently of the positive power line Vcc. The input current to the PNP current mirror in FIG. 3 is equal to the reference voltage Vref minus a VBE of a transistor Q10 divided by RS. The circuit is arranged with the NPN transistor Q10 having its base connected to the reference voltage. The emitter of transistor Q10 is connected to one end of the resistor RS. The other end of the resistor R8 is connected to ground. The collector of transistor Q10 is connected to the collector of a PNP transistor P3. The base and collector of transistor P3 are tied together. The base of transistor P3 is connected to the bases of transistors P2 and P1. The collector current of transistor Q10 is thus mirrored to PNP transistors P2 and P1. The VBE of transistor Q10 will insert a temperature coefficient into the currents produced by the PNP current mirror. However, as long as R5 is smaller than R6, the current provided to the error amplifier will always exceed the current provided to the control current source transistor Q4. The output current limit set by the circuit of FIG. 3 will be the same as that for FIG. 1 if R9 is omitted. In FIG. 3, another option for inputting current to the current mirror is to add one or more diodes in series with resistor R8. This would change the temperature coefficient of the currents produced.

An optional element which may be used in any of the circuit embodiments is a resistor R9 connected between the emitter of the current sensing transistor and ground. This addition, however, will change the relationship between the collector voltage at the current sense transistor and the output current from being a direct relationship to being an exponential relationship with a temperature coefficient. The resistor R9 will decrease the amount of current that is mirrored through the current sensing transistor Q3. This is useful in an integrated circuit to minimize power dissipation. With the resistor R9 in place and having no resistance between the emitter of the output transistor Q1 and ground the current limit value is then approximated by the following equation:

$$I_{limit} = (R2/R1) \times K \times I_{ref} \times \exp\left[\frac{((R2/R1) \times I_{ref} \times R9)}{V_T}\right]$$

If a resistance RE exists between the emitter of the output transistor Q1 and ground, the formula for the current limiter becomes a transcendental equation as follows:

$$I_{limit} = (R2/R1) \times K \times$$

$$I_{ref} \times \exp\left[\frac{((R2/R1) \times I_{ref} \times R9) - (I_{limit} \times RE)}{V_T}\right]$$

Thus, while the collector voltage of the current sensing transistor provides a measure of the output current, it is not necessary that that measure be a direct relationship.

Figure 4:
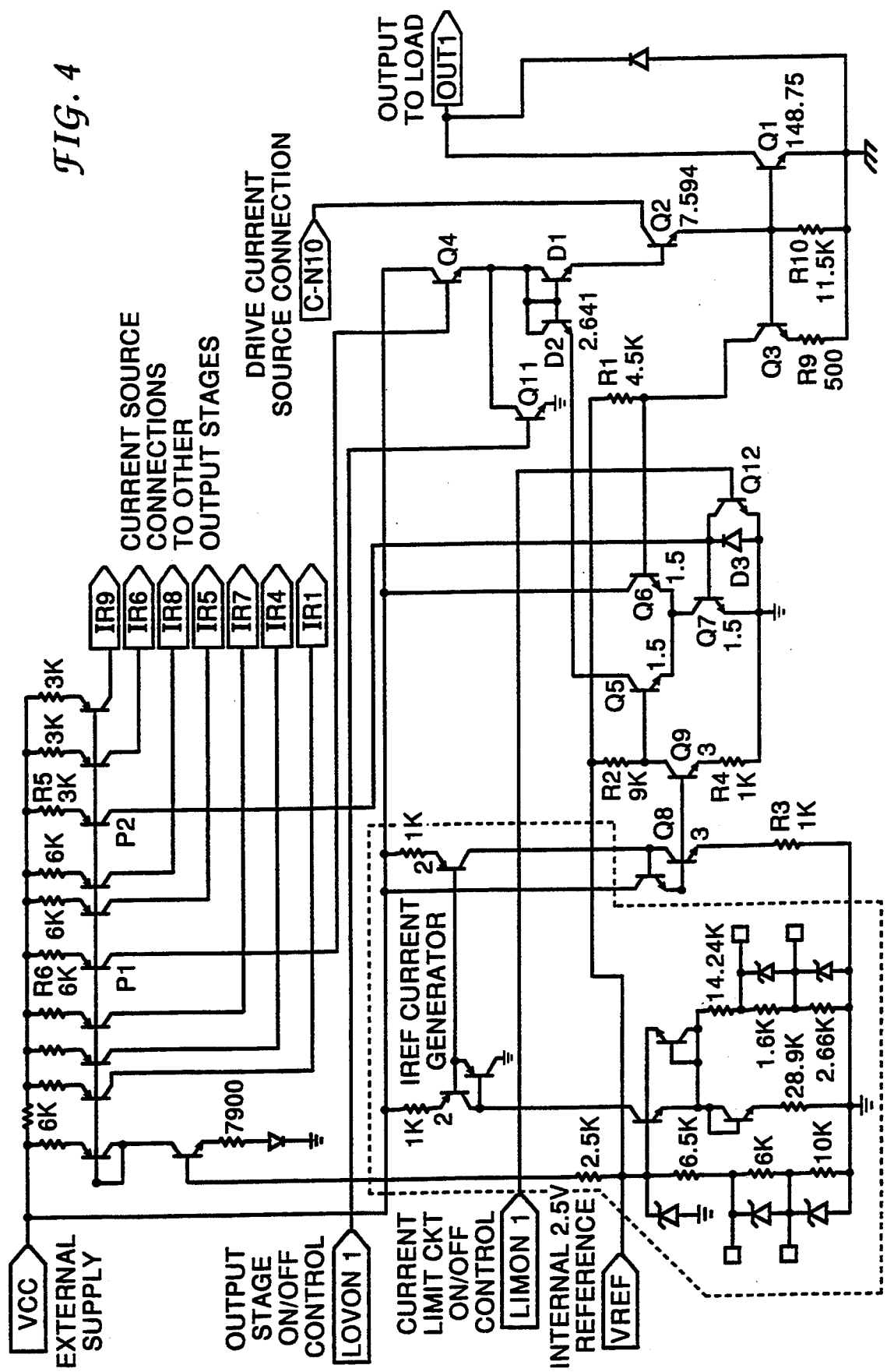
FIG. 4 is a more detailed schematic of an integrated circuit incorporating the transistor overprotection circuit of the present invention.

The presently preferred embodiment of the invention is shown in detail in the schematic of FIG. 4. Here, an output stage on/off control is shown. An output control switch transistor Q11 is included in the circuit. The collector of output control switch transistor Q11 is connected to the emitter of control current source transistor Q4. The base of Q11 is connected to an on/off control terminal and the emitter is connected to ground. When the on/off input is low, transistor Q11 is off and the circuit functions normally. When the on/off input is high, output control switch transistor Q11 is on, shunting the emitter current of control current source transistor Q4 to ground. This shuts off the driver transistor Q2 and hence the output transistor Q1 as well.

It would be undesirable, if when output control switch transistor Q11 is turned on, for driver transistor Q2 to get turned on by first transistor Q5 of the error amplifier. To prevent this a blocking diode D2 is inserted between the collector of output control switch transistor Q11 and the collector of first transistor Q5. In the preferred embodiment, blocking diode D2 is formed by a transistor with its base and collector tied together. Without blocking diode D2, it would be possible with transistor Q11 sinking current, for the base collector junction of first transistor Q5 to become forward biased. First transistor Q5 could then provide current which prevents driver transistor Q2 from completely turning off. Blocking diode D2 ensures the proper operation of the on/off output control switch.

An on/off control switch for the current limit circuit itself may also be included. An on/off current limit control switch transistor Q12 is shown in FIG. 4 with its collector connected to the base of third transistor Q7 of the error amplifier, its emitter connected to ground and its base connected to a current limit on/off terminal. When the current limit on/off terminal provides a low signal, transistor Q12 is off and the circuit operates normally. When the current limit on/off terminal provides a high signal, transistor Q12 is turned on thereby turning off third transistor Q7 of the error amplifier disabling the current limit function. This may be advantageously used to reduce power consumption by the integrated circuit when the output transistor Q1 is not in use. With third transistor Q7 off, current I1 is not multiplied by $\beta$ so current drain is reduced.

FIG. 4 also illustrates a useful technique to quicken the turn off of output transistor Q1 and current sensing transistor Q3. A bleed resistor R10 is inserted from the bases of output transistor Q1 and current sensing transistor Q3 to the negative power line. When driver transistor Q2 shuts off, the stored charge in the bases of output transistor Q1 and current sensing transistor Q3 is drained through the bleed resistor R10. Also illustrated in FIG. 4 are the details of a current generator for generating Iref in the presently preferred embodiment.

Of course, it should be understood that various changes and modifications to the preferred embodiments described above will be apparent to those skilled in the art. For example, it is well known in the art that a current source is often interchangeable with a voltage source connected across a resistor. Generation of currents and setting of threshold voltages may also be accurately fixed by the use of resistors or current references that may be trimmed in the final integrated circuit. Moreover, numerous equivalent methods for configuring an error amplifier are known in the art. These and other changes can be made without departing from the spirit and scope of the invention and without diminishing its attendant advantages. It is therefore intended that such changes and modifications be covered by the following claims.

We claim:

1. A transistor protection circuit comprising:
   an output transistor including a collector, a base and an emitter;
   a current sensing transistor, including a collector, a base coupled to the base of said output transistor and an emitter, arranged in said protection circuit so as to have a collector voltage that is a measure of the collector current of said output transistor;
   a source of control current arranged in said protection circuit so as to deliver drive current to the base of said output transistor; and
   an error amplifier having a first input connected to a threshold voltage, a second input coupled to the collector of said current sensing transistor and an output coupled to said source of control current such that, when the collector voltage of said current sensing transistor falls below the threshold voltage, the control current reaching the base of said output transistor is reduced so as to reduce the collector current of said output transistor.

2. The transistor protection circuit of claim 1 further comprising a current generator which generates two currents, a first current of said two currents being provided to control said source of control current and a second current of said two currents being provided to drive said error amplifier.

3. The transistor protection circuit of claim 2 wherein said current generator comprises a current mirror which generates the two currents in response to an input current.

4. The transistor protection circuit of claim 3 further comprising a constant current source for providing said input current to said current mirror.

5. The transistor protection circuit of claim 3 further comprising a voltage source connected in parallel with a resistor for providing said input current to said current mirror.

6. The transistor protection circuit of claim 2 wherein said current generator comprises two constant current sources.

7. The transistor protection circuit of claim 2 wherein said error amplifier comprises a first transistor having a base acting as said first input, a collector coupled to said source of control current and an emitter, a second transistor having a base acting as said second input, a collector connected to a positive power line and an emitter connected to the emitter of said first transistor, and a third transistor having a collector connected to the emitters of said first and second transistors, a base connected to the second current of said current generator, and an emitter connected to a negative power line.

8. The transistor protection circuit of claim 7 wherein said error amplifier further comprises a temperature compensation diode having a cathode connected to the base of the third transistor and an anode connected to the negative power line.

9. The transistor protection circuit of claim 7 further comprising a control switch transistor having a base for receiving a control signal, a collector connected to the base of the third transistor of said error amplifier and an emitter connected to the negative power line such that said control signal turns on said control switch transistor to turn off the third transistor and disable said error amplifier.

10. The transistor protection circuit of claim 1 further comprising a driver transistor having a base coupled to said source of control current, an emitter coupled to the base of said output transistor and a collector.

11. The transistor protection circuit of claim 10 wherein said source of control current comprises a control current source transistor having a collector connected to a positive power line, a base and an emitter coupled to the base of said driver transistor.

12. The transistor protection circuit of claim 11 wherein said output transistor, said current sensing transistor, said driver transistor and said control current source transistor are all NPN transistors.

13. The transistor protection circuit of claim 11 further comprising voltage level shifting means connected to the base of said driver transistor and coupled to the output of said error amplifier for contributing to an increased voltage level at the output of said error amplifier.

14. The transistor protection circuit of claim 1 further comprising a reference voltage source, a reference resistor connected to said reference voltage source and means for supplying a reference current through said reference resistor and wherein said threshold voltage is taken from an end of said reference resistor opposite from said reference voltage source.

15. The transistor protection circuit of claim 14 wherein said means for supplying a reference current comprises a constant current source.

16. The transistor protection circuit of claim 14 wherein said means for supplying a reference current comprises a constant current source and a current mirror connected to receive a constant current from said constant current source and to provide the reference current to said reference resistor.

17. The transistor protection circuit of claim 1 further comprising a control switch transistor having a base for receiving a control signal, a collector connected to said source of control current and an emitter coupled to a negative power line wherein said control signal forward biases the base-emitter junction of said control switch transistor to sink the control current from said source of control current so that said output transistor is unable to turn on.

18. The transistor protection circuit of claim 17 further comprising a blocking diode having a cathode connected to the output of said error amplifier and an anode connected to the collector of said control switch transistor.

19. The transistor protection circuit of claim 1 further comprising a resistor connected between the emitter of said current sensing transistor and ground.

20. A transistor protection circuit comprising:
   an output transistor including a collector, a base and an emitter;
   a driver transistor having a collector, a base and an emitter, the emitter being coupled to the base of said output transistor;
   a reference voltage source;
   a current sensing transistor including a collector, a base and an emitter arranged in said protection circuit so as to have a collector current that is a measure of the collector current of said output transistor;
   a current sense resistor connected between said reference voltage source and the collector of said current sensing transistor;
   a source of control current coupled to the base of said driver transistor;
   means for deriving a threshold voltage from said reference voltage source; and
   an error amplifier having a first input connected to the threshold voltage, a second input coupled to the collector of said current sensing transistor and an output coupled to said source of control current such that when the collector voltage of said current sensing transistor falls below the threshold voltage the control current reaching the base of said driver transistor is reduced.

21. The transistor protection circuit of claim 20 further comprising a current generator which generates two currents, a first current of said two currents being provided to control said source of control current and a second current of said two currents being provided to drive said error amplifier.

22. The transistor protection circuit of claim 21 wherein said current generator comprises a current mirror which generates the two currents in response to an input current.

23. The transistor protection circuit of claim 22 further comprising a constant current source for providing said input current to said current mirror.

24. The transistor protection circuit of claim 22 further comprising a resistor coupled to said reference voltage source for deriving said input current for said current mirror.

25. The transistor protection circuit of claim 21 wherein said current generator comprises two constant current sources.

26. The transistor protection circuit of claim 21 wherein said error amplifier comprises a first transistor having a base acting as said first input, a collector coupled to said source of control current and an emitter, a second transistor having a base acting as said second input, a collector connected to a positive power line and an emitter connected to the emitter of said first transistor, and a third transistor having a collector connected to the emitters of said first and second transistors, a base connected to the second current of said current generator, and an emitter connected to a negative ground line.

27. The transistor protection circuit of claim 26 wherein said error amplifier further comprises a temperature compensation diode having a cathode to the base of the third transistor and an anode connected to the negative power line.

28. The transistor protection circuit of claim 27 further comprising a control switch transistor having a base for receiving a control signal, a collector connected to the base of the third transistor of said error amplifier and an emitter connected to the negative power line such that said control signal turns on said control switch transistor to turn off the third transistor and disable said error amplifier.

29. The transistor protection circuit of claim 26 further comprising a control switch transistor having a base for receiving a control signal, a collector connected to said source of control current and an emitter coupled to a negative power line wherein said control signal forward biases the base-emitter junction of said control switch transistor to sink the control current from said source of control current so that said output transistor is unable to turn on.

30. The transistor protection circuit of claim 29 further comprising a blocking diode having a cathode connected to the collector of the first transistor of said error amplifier and an anode connected to the collector of said control switch transistor.

31. The transistor protection circuit of claim 20 wherein said source of control current comprises a control current source transistor having a collector connected to a positive power line, a base and an emitter coupled to the base of said driver transistor.

32. The transistor protection circuit of claim 31 wherein said output transistor, said current sensing transistor, said driver transistor and said control current source transistor are all NPN transistors.

33. The transistor protection circuit of claim 20 further comprising voltage level shifting means connected to the base of said driver transistor and coupled to the output of said error amplifier for contributing to an increased voltage level at the output of said error amplifier.

34. The transistor protection circuit of claim 20 wherein said means for deriving a threshold voltage comprises a reference resistor connected to said reference voltage source and a constant current source for supplying a reference current through said reference resistor and wherein said threshold voltage is taken from an end of said reference resistor opposite from said reference voltage source.

35. The transistor protection circuit of claim 20 wherein said means for deriving a threshold voltage comprises a reference resistor connected to said reference voltage source, a constant current source and a current mirror connected to receive a constant current from said constant current source and to provide a reference current to said reference resistor.

36. The transistor protection circuit of claim 20 further comprising a resistor connected between the emitter of said current sensing transistor and ground.

37. A transistor protection circuit comprising:
an output transistor having a collector, a base and an emitter;
a driver transistor having a collector, a base and an emitter, the emitter being coupled to the base of said output transistor;
a reference voltage source;
a current sensing transistor including a collector, a base and an emitter arranged in said protection circuit so as to have a collector current that is a measure of the collector current of said output transistor;
a current sense resistor connected between said reference voltage source and the collector of said current sensing transistor;
a reference resistance having two ends, one of said two ends being connected to said reference voltage source;
means for supplying a reference current through said reference resistance so as to establish a threshold voltage at the end of said reference resistance opposite to said reference voltage source;
a source of control current coupled to the base of said driver transistor;
an error amplifier having a first input connected to the end of said reference resistance opposite to said reference voltage source, a second input coupled to the collector of said current sensing transistor and an output coupled to said source of control current such that when the collector voltage of said current sensing transistor falls below the threshold voltage the control current reaching the base of said driver transistor is reduced; and
a current generator which generates two currents, a first current of said two currents being provided to control said source of control current and a second current of said two currents being provided to drive said error amplifier.

38. A transistor protection circuit comprising:
an output transistor including a collector, a base and an emitter;
drive means coupled to the base of said output transistor;
a current sensing transistor, including a collector, a base and an emitter, arranged in said protection circuit so as to have a collector voltage that is a measure of the collector current of said output transistor;
a source of control current coupled to said drive means for controlling said drive means;
an error amplifier having a first input connected to a threshold voltage, a second input coupled to the collector of said current sensing transistor and an output coupled to said source of control current such that, when the collector voltage of said current sensing transistor falls below the threshold voltage, the control current reaching said drive means is reduced so as to reduce the collector current of said output transistor; and a current generator which generates two currents, a first current of said two currents being provided to control said source of control current and a second current of said two currents being provided to drive said error amplifier.

39. The transistor protection circuit of claim 38 wherein said error amplifier comprises a first transistor having a base acting as said first input, a collector coupled to said source of control current and an emitter, a second transistor having a base acting as said second input, a collector connected to a positive power line and an emitter connected to the emitter of said first transistor, and a third transistor having a collector connected to the emitters of said first and second transistors, a base connected to the second current of said current generator, and an emitter connected to a negative power line.

40. The transistor protection circuit of claim 39 wherein said error amplifier further comprises a temperature compensation diode having a cathode connected to the base of the third transistor and an anode connected to the negative power line.

41. The transistor protection circuit of claim 39 further comprising a control switch transistor having a base for receiving a control signal, a collector connected to the base of the third transistor of said error amplifier and an emitter connected to the negative power line such that said control signal turns on said control switch transistor to turn off the third transistor and disable said error amplifier.

* * * * *